United States Patent
Tu

(10) Patent No.: US 8,400,870 B2
(45) Date of Patent: Mar. 19, 2013

(54) MEMORY DEVICES AND ACCESSING METHODS THEREOF

(75) Inventor: Ying Te Tu, Kaohsiung (TW)

(73) Assignee: Winbond Electronics Corp., Taichung (TW)

( * ) Notice: Subject to any disclaimer, the term of this patent is extended or adjusted under 35 U.S.C. 154(b) by 150 days.

(21) Appl. No.: 12/984,239

(22) Filed: Jan. 4, 2011

(65) Prior Publication Data

US 2012/0170400 A1 Jul. 5, 2012

(51) Int. Cl.
*G11C 13/04* (2006.01)

(52) U.S. Cl. ............... 365/235; 365/189.2; 365/230.04; 365/230.05

(58) Field of Classification Search .............. 365/236, 365/189.2, 230.04, 230.05
See application file for complete search history.

(56) References Cited

U.S. PATENT DOCUMENTS

| | | | |
|---|---|---|---|
| 6,324,114 B1 * | 11/2001 | Himeno | 365/230.03 |
| 7,391,634 B2 * | 6/2008 | Kim et al. | 365/51 |
| 7,466,577 B2 * | 12/2008 | Sekiguchi et al. | 365/51 |
| 7,865,657 B2 * | 1/2011 | Kim et al. | 711/103 |
| 8,004,870 B2 * | 8/2011 | Tu | 365/63 |
| 2004/0136218 A1 | 7/2004 | Magnavacca et al. | |

* cited by examiner

*Primary Examiner* — Pho M Luu
(74) *Attorney, Agent, or Firm* — Muncy, Geissler, Old & Lowe, PLLC

(57) ABSTRACT

A memory device is provided. The memory device comprises a plurality of memory chips. The plurality of memory chips receive an input address code and alternately operate in an active mode. Each memory chip receives a selection signal and operates according to an internal address counter code. For each memory chip, the respective internal address counter code is initially set according to the input address code and the respective selection signal.

17 Claims, 6 Drawing Sheets

1

2

MEMORY DEVICES AND ACCESSING METHODS THEREOF

BACKGROUND OF THE INVENTION

1. Field of the Invention

The invention relates to a memory device, and more particularly to a memory device comprising stacked memory chips.

2. Description of the Related Art

FIG. 1 is a schematic view showing a 256 Mb memory chip. Referring to FIG. 1, the memory chip 1 comprises 24 address pads A0~A23, a dummy pad NC, and a selection pad SP. When the memory chip 1 operates as a single memory die, both of the option pad SP and the dummy pad NC are floating. A weak pulling high/low circuit on the inside of the memory chip 1 gradually pulls an internal node which is connected with the option pad SP to a high/low voltage level.

In some applications, two memory chips, such as two memory chips as shown in FIG. 1, can be stacked to form a memory device. One memory chip operates as a top memory chip among the two stacked memory chips, and the other memory chip operates as a bottom memory chip among the two stacked memory chips. At this time, each memory chip requires another address pad serving as the $25^{th}$ address pad to address the two stacked memory chips. When an access operation is performed by crossing the two stacked memory chips, for example, when an access operation to the top memory chip is finished and then is continuously performed to the bottom memory chip, the top memory chip has to enter into an inactive mode, while the bottom memory chip has to enter into an active mode. On the contrary, when the access operation to the bottom memory chip is finished and then is continuously performed to the top memory chip, the bottom memory chip has to enter into an inactive mode, while the top memory chip has to enter into an active mode. Thus, when a memory chip is designed to be capable of operating as a single memory chip or one of stacked memory chips, controlling switching of the memory chip between an active mode and an inactive mode is an important issue.

BRIEF SUMMARY OF THE INVENTION

One exemplary embodiment of a memory device comprises a plurality of memory chips (20, 21). The plurality of memory chips receive an input address code (ADD) and alternately operate in an active mode. Each memory chip receives a selection signal and operates according to an internal address counter code (AC). For each memory chip, the respective internal address counter code is initially set according to the input address code and the respective selection signal.

Another exemplary embodiment of a memory device comprises a first memory chip and a second memory chip. The first memory chip receives an input address code and a first selection signal and operates according to a first internal address counter code. The second memory chip receives the input address code and a second selection signal and operates according to a second internal address counter code. A most significant bit of the first internal address counter code is initially set by performing a logical exclusive OR (XOR) operation to a most significant bit of the input address code and a logic value of the first selection signal. A most significant bit of the second internal address counter code is initially set by performing the XOR operation to a most significant bit of the input address code and the logic value of the second selection signal.

An exemplary embodiment of an accessing method for a memory device is provided. The memory device comprises a plurality of memory chips. The plurality of memory chips receive an input address code, and each memory chip receives a selection signal. The accessing method comprises the steps of: for each memory chip, initially setting the respective internal address counter code according to the input address code and the respective selection signal; and controlling each memory chip to operate in an active mode or an inactive mode according to the respective internal address counter code.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
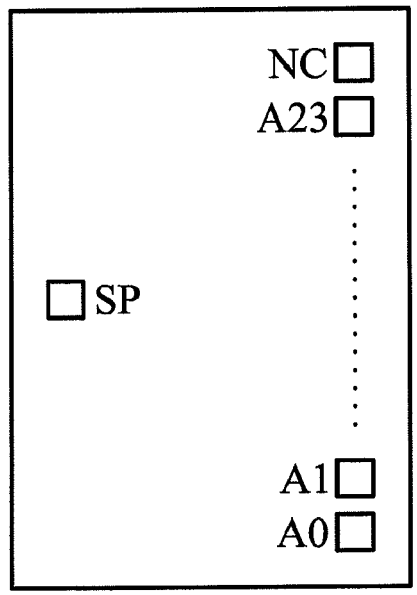
FIG. 1 is a schematic view showing a 256 Mb memory chip.
Figure 2:
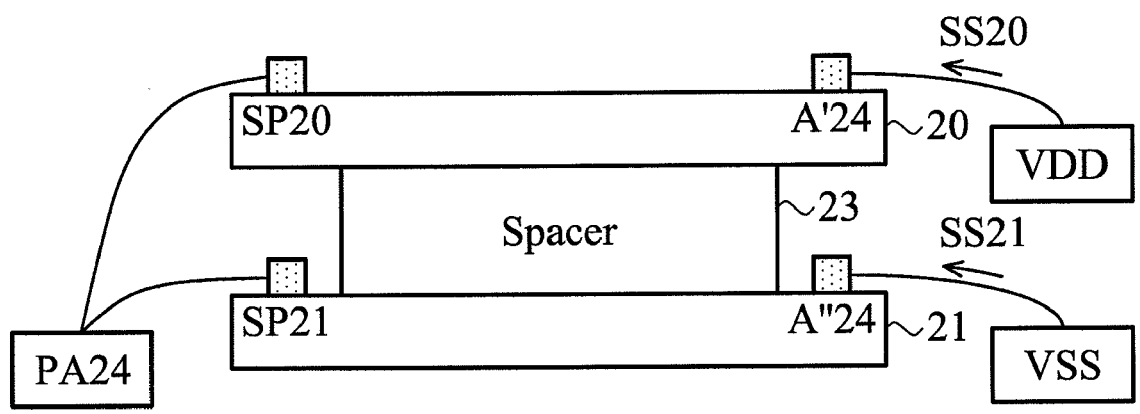
FIG. 2 shows an exemplary of a memory device comprising two stacked memory chips.
Figure 3:
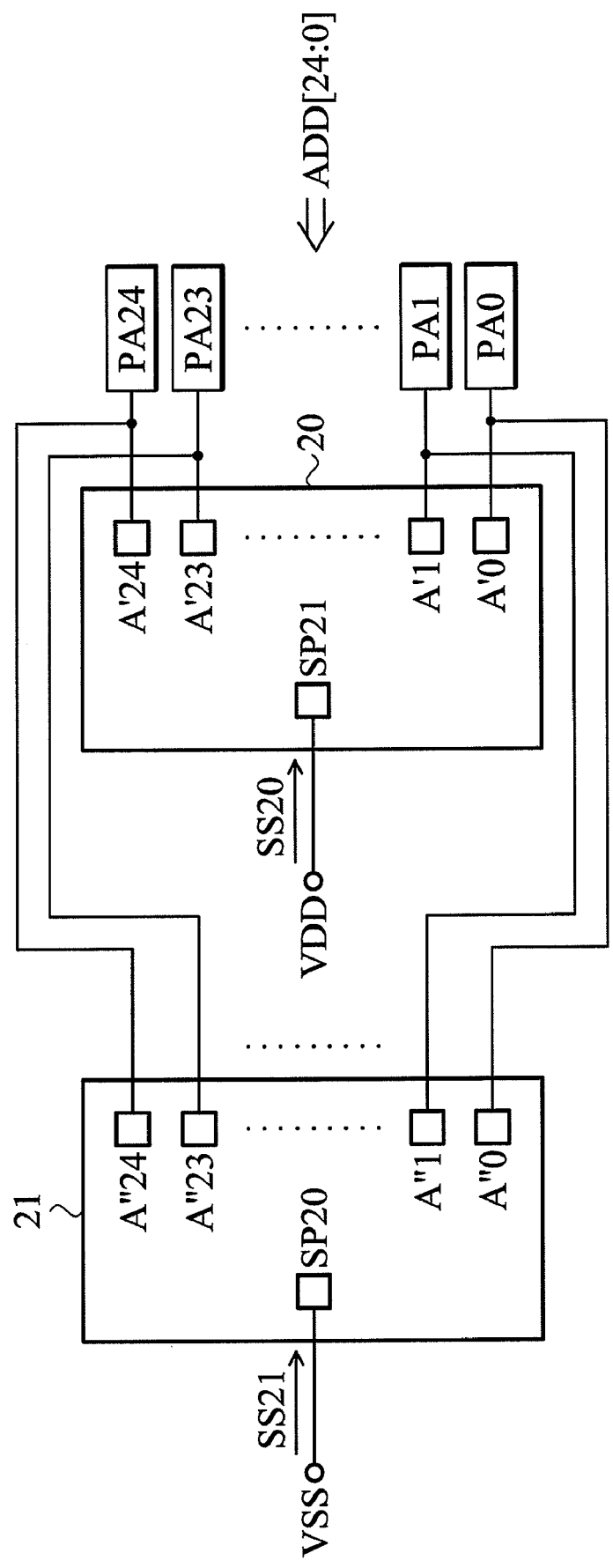
FIG. 3 is a schematic view showing connections between address pads of the two stacked memory chips of FIG. 2.

FIG. 2 shows an example of a memory device comprising two stacked memory chips. FIG. 3 is a schematic view showing connections between address pads of the two stacked memory chips of FIG. 2. In order to clearly show the connections, the two memory chips are shown side by side, and, however, in practice, one memory chip is stacked on the other memory chip, as shown in FIG. 2. Referring to FIGS. 2-3, two memory chips 20 and 21 are stacked to form a memory device 2. The memory chip 20 serving as a top memory chip is stacked on the memory chip 21 serving as a bottom memory chip, and a spacer 23 is therebetween. Each of the stacked memory chips 20 and 21 comprises 25 address pads and a selection pad. Referring to FIG. 3, address pads A'0~A'24 of the memory chip 20 are connected to address pads A"0~A"24 of the memory chip 21 at address pads PA0~PA24, respectively. The memory chips 20 and 21 receive an input address code ADD[24:0] through the address pads PA0~PA24 and the respective address pads A'0~A'24 and A"0~A"24

In FIG. 3, a selection pad SP20 of the top memory chip 20 is tied to a selection signal SS20 with a high voltage level of a voltage source VDD, while a selection pad SP21 of the bottom memory chip 21 is tied to a selection signal SS21 with a low voltage level of a voltage source VSS. In the embodiment, since the selection pad SP20 of the top memory chip 20 is tied to the selection signal SS20 with the high voltage level of the voltage source VDD while the selection pad SP21 of the bottom memory chip 21 is tied to the selection signal SS21 with the low voltage level of the voltage source VSS, the logic value of the selection signal SS20 of the top memory chip 20 is equal to "1", while the logic value of the selection signal SS21 of the bottom memory chip 21 is equal to "0". For each memory chip, when the logic value of the selection signal is determined, which one of the memory chips 20 and 21 is selected to be activated is determined according to whether the logic value of the $25^{th}$ bit ADD[24] and the logic value of the selection signal are equal. In an embodiment, the logic values of the selection signals SS20 and SS21 relate to a sequence for accessing the memory chips 20 and 21. When the address pad PA24 receives the $25^{th}$ bit ADD[24] of the input address code ADD[24:0] with a logic high value (ADD[24]=1), the top memory chip 20 is selected to be activated (entering into an active mode) due to the fact that the logic value of the selection signal SS20 is equal to "1", while the bottom memory chip 21 is selected to be inactivated (entering into an inactive mode) due to the fact that the logic value of the selection signal SS21 is equal to "0". Contrarily, when the address pad PA24 receives the $25^{th}$ bit ADD[24] of the input address code ADD[24:0] with a logic low value (ADD[24]=0), the bottom memory chip 21 is selected to be activated, while the top memory chip 20 is selected to be inactivated.

According to an exemplary embodiment, when it is desired for the memory chip 2 to be accessed, the memory chips 20 and 21 receive the input address code ADD[24:0] and respectively generates internal address counter codes AC20[24:0] and AC21[24:0]. The length of the input address code ADD[24:0] and the length of the internal address counter codes AC20[24:0] and AC21[24:0] of the memory chips 20 and 21 are the same. At the beginning of the access operation, the $1^{th}$~$24^{th}$ bits ADD[0]~ADD[23] of the input address code ADD initially serve as the $1^{th}$~$24^{th}$ bits AC20[0]~AC20[23] of the internal address counter code AC20 of the memory chip 20 and as the $1^{th}$~$24^{th}$ bits AC21[0]~AC21[23] of the internal address counter code AC21 of the memory chip 21. In other words, the $1^{th}$~$24^{th}$ bits AC20[0]~AC20[23] of the internal address counter code AC20 of the memory chip 20 are initially set as the $1^{th}$~$24^{th}$ bits ADD[0]~ADD[23] of the input address code ADD, respectively, and the $1^{th}$~$24^{th}$ bits AC21[0]~AC21[23] of the internal address counter code AC21 of the memory chip 21 are initially set as the $1^{th}$~$24^{th}$ bits ADD[0]~ADD[23] of the input address code ADD, respectively. Moreover, at the beginning of the access operation, for each of the memory chips 20 and 21, the most significant bit set of the respective internal address counter code is initially set according to the most significant bit set of the input address code ADD and the logic value of the respective selection signal. In the embodiment, the most significant bit set of the input address code ADD comprises one bit, that is, the most significant bit (the $25^{th}$ bit) ADD[24], and each of the most significant bit sets of the respective internal address counter codes AC20 and AC21 of the memory chips 20 and 21 also comprises one bit, that is, the most significant bit (the $25^{th}$ bit) AC20[24]/AC21[24]. Accordingly, the $25^{th}$ bit of the respective internal address counter code of each of the memory chips 20 and 21 is initially set according to the $25^{th}$ bit ADD[24] and the logic value of the respective selection signal. In the embodiment, for each of the memory chips 20 and 21, the $25^{th}$ bit of the respective internal address counter code is initially set by performing a logical exclusive OR (XOR) operation to the $25^{th}$ bit ADD[24] of the input address code ADD and the logic value of the respective selection signal. According to the logical XOR operation, when the $25^{th}$ bit of the respective internal address counter code is equal to a logic low value ("0"), the corresponding memory chip is activated (active mode); when the $25^{th}$ bit of the respective internal address counter code is equal to a logic high value ("1"), the corresponding memory chip is inactivated (inactive mode).

Figure 4B:
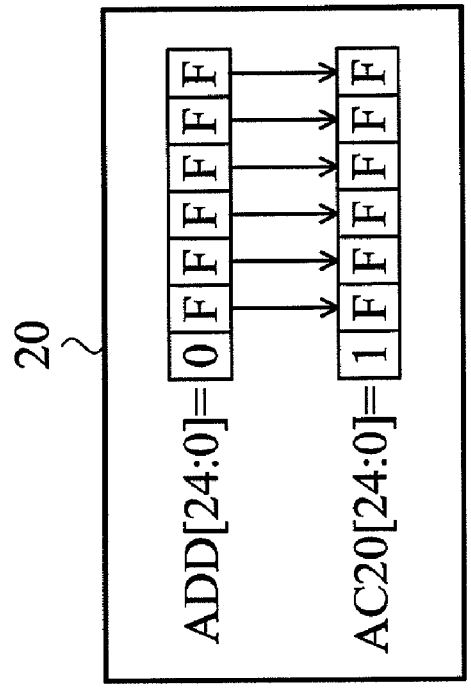
FIGS. 4a-4b are schematic views showing an exemplary embodiment of the relationship between an input address code ADD and respective internal address counter codes of the memory chips in FIG. 2.
Figure 4A:
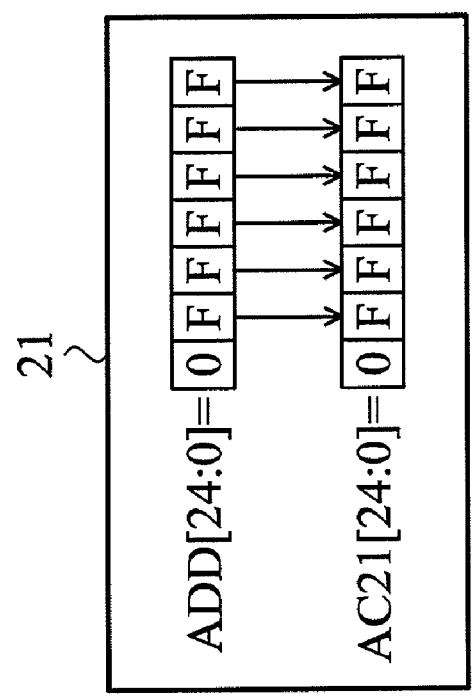

In the following, an exemplary embodiment of accessing the memory chip 2 will be described. FIGS. 4a and 4b are schematic views showing an exemplary embodiment of the relationship between the input address code ADD and the respective internal address counter codes AC20 and AC21 of the memory chips 20 and 21. Assume that the input address code ADD is initially equal to "0FFFFFF" (ADD[24:0]=0FFFFFF) at the beginning of the access operation performed on the memory chip 2. According to the $25^{th}$ bit ADD[24] of the initial input address code ADD (ADD[24]=0), the access operation is performed to the bottom memory chip 21 due to the fact that the selection pad SP is tied to the low voltage level of the voltage source VSS. Referring to FIG. 4, the $1^{th}$~$24^{th}$ bits AC21[0]~AC21[23] of the internal address counter code AC21 of the bottom memory chip 21 are initially set as the $1^{th}$~$24^{th}$ bits ADD[0]~ADD[23] of the input address code ADD, respectively, and the $25^{th}$ bit AC21[24] of the internal address counter code AC21 of the bottom memory chip 21 is initially set by performing a logical XOR operation to the $25^{th}$ bit ADD[24] (="0") of the input address code ADD and the logic value of the selection signal SS21 with the low high value ("0"). Thus, the internal address counter code AC21 of the bottom memory chip 21 is initially equal to "0FFFFFF", wherein AC[24]=0 XOR 0=0. The $1^{th}$~$24^{th}$ bits AC20[0]~AC20[23] of the internal address counter code AC20 of the top memory chip 20 are initially set as the values of the $1^{th}$~$24^{th}$ bits ADD[0]~ADD[23] of the input address code ADD, respectively, and the $25^{th}$ bit AC20[24] of the internal address counter code AC20 of the top memory chip 20 is initially set by performing a logical XOR operation to the $25^{th}$ bit ADD[24] (="0") of the input address code ADD and the logic value of the selection signal SS20 with the logic high value ("1"). Thus, the internal address counter code AC20 of the top memory chip 20 is initially equal to "1FFFFFF", wherein AC[24]=0 XOR 1=1. Since the $25^{th}$ bit AC21[24] of the internal address counter code AC21 of the bottom memory chip 21 is equal to logic "0" while the $25^{th}$ bit AC20[24] of the internal address counter code AC20 of the top memory chip 20 is equal to logic "1", the bottom memory chip 21 operates in the active mode according to its internal address counter code AC (="0FFFFFF"), while the top memory chip 20 operates in the inactive mode according to its internal address counter code AC (="1FFFFFF").

Figure 5A:
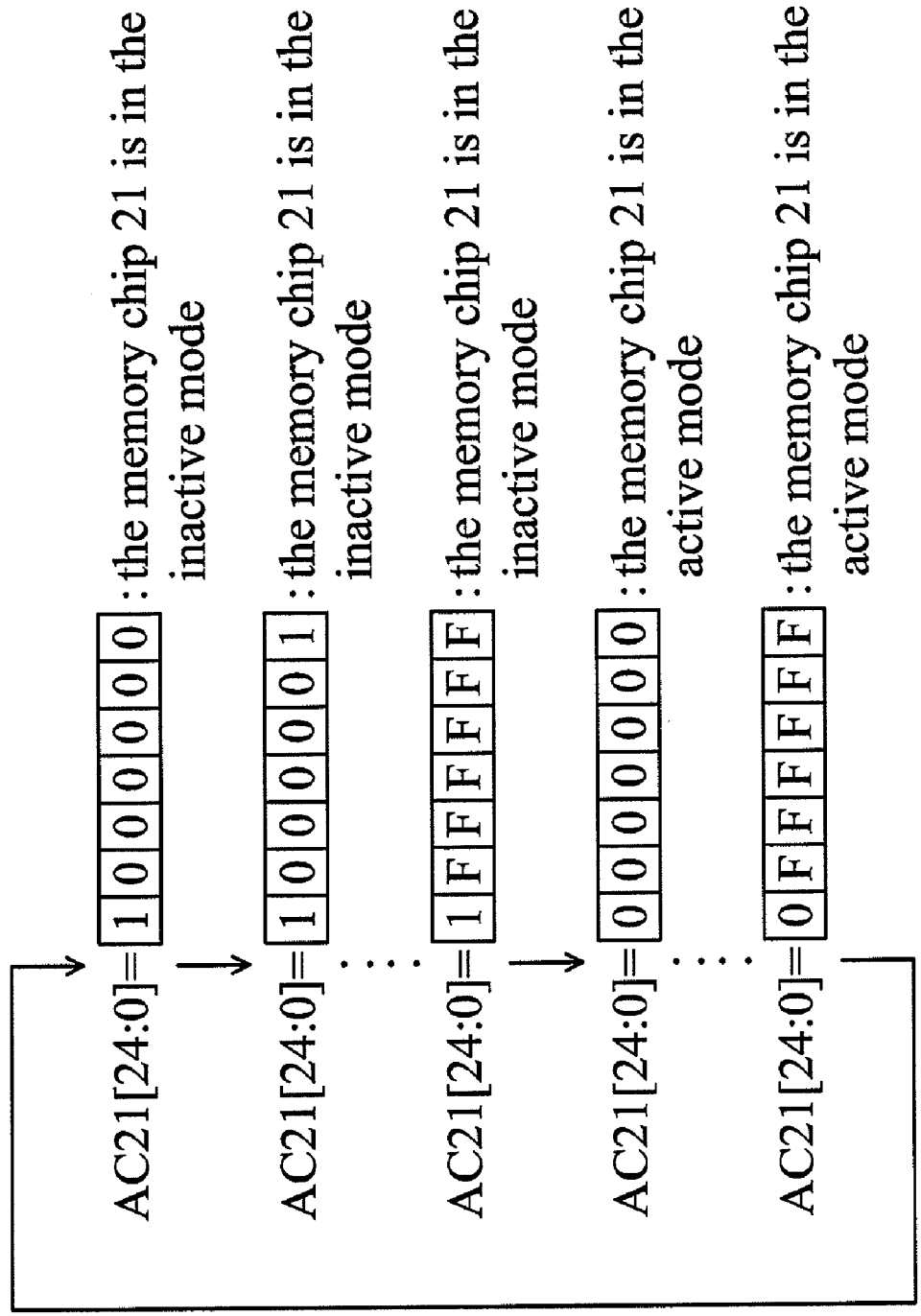
FIGS. 5a and 5b are schematic views showing the relationship between the respective internal address counter codes of the memory chips and the modes thereof.
Figure 5B:
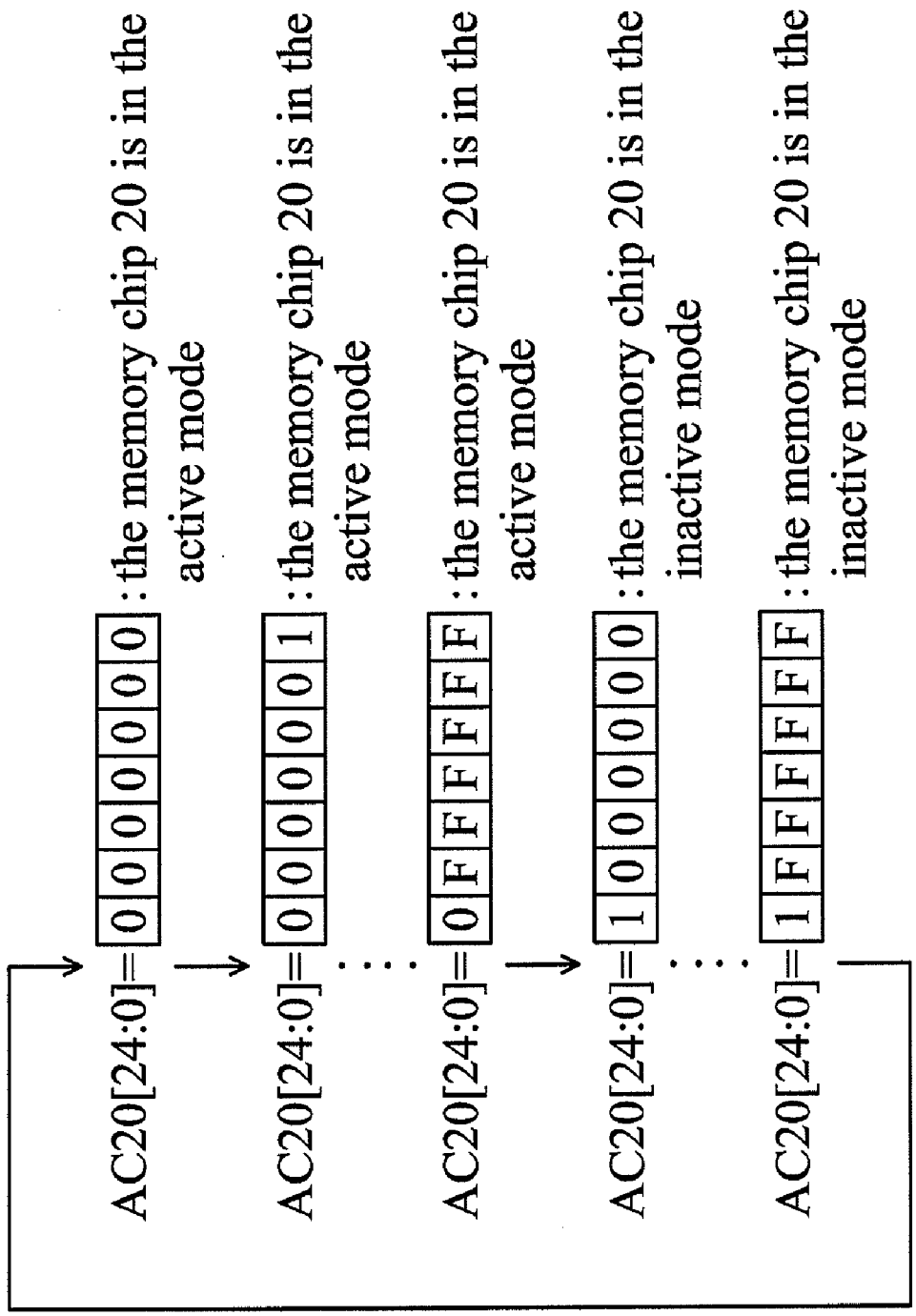

After the initial values of the internal address counter codes AC20 and AC21 of the memory chips 20 and 21 are set, the internal address counter codes AC are continuously increased forward by "1" at each time by internal counters of the memory chips 20 and 21. Referring to FIGS. 5a and 5b, after the internal address counter codes AC20 and AC21 of the memory chips 20 and 21 are increased forward by "1" from their initial values, the internal address counter code AC21 of the bottom memory chip 21 is changed to "1000000" from "0FFFFFF", and the internal address counter code AC20 of the top memory chip 20 is changed to "0000000" from "1FFFFFF". Since the $25^{th}$ bit AC21[24] of the internal address counter code AC21 of the bottom memory chip 21 is changed to logic "1" and the $25^{th}$ bit AC20[24] of the internal address counter code AC20 of the top memory chip 20 is changed to logic "0", the bottom memory chip 21 is switched to enter into the inactive mode, while the top memory chip 20 is switched to enter into an active mode. The bottom memory chip 21 is still in the inactive mode during the period when the respective internal address counter code AC21 is continuously increased from "1000000" to "1FFFFFF". The top memory chip 20 is still in the active mode during the respective internal address counter code AC20 is continuously increased from "0000000" to "0FFFFFF".

When the internal address counter code AC21 of the bottom memory chip 21 is increased to "0000000" from "1FFFFFF" by the respective internal counter, the bottom memory chip 21 is switched to enter into an active mode again. Similarly, when the internal address counter code AC20 of the top memory chip 20 is increased to "1000000" from "0FFFFFF" by the respectively internal counter, the top memory chip 20 is switched to enter into the inactive mode again.

According to the above embodiment, at the beginning of the access operation performed on the memory chip 2, the internal address counter codes AC20 and AC21 of the memory chips 20 and 21 are initially set according to the input address ADD and the respective selection signals SS20 and SS21. The operation modes of the memory chips 20 and 21 at the beginning of the access operation can be determined according to the initial values of the internal address counter codes AC20 and AC21 of the memory chips 20 and 21; especially the $25^{th}$ bits AC20[24] and AC21[24] of the internal address counter codes AC20 and AC21. After, the internal address counter codes AC20 and AC21 of the memory chips 20 and 21 are increased by the respective internal counters, the $25^{th}$ bits AC20[24] and AC21[24] of the internal address counter codes AC20 and AC21 are changed between "0" and "1" with the countering operation of the respective internal counters. Thus, the memory chips 20 and 21 can operate between the active mode and the inactive mode according to the respective internal address counter codes AC20 and AC21.

Figure 6:
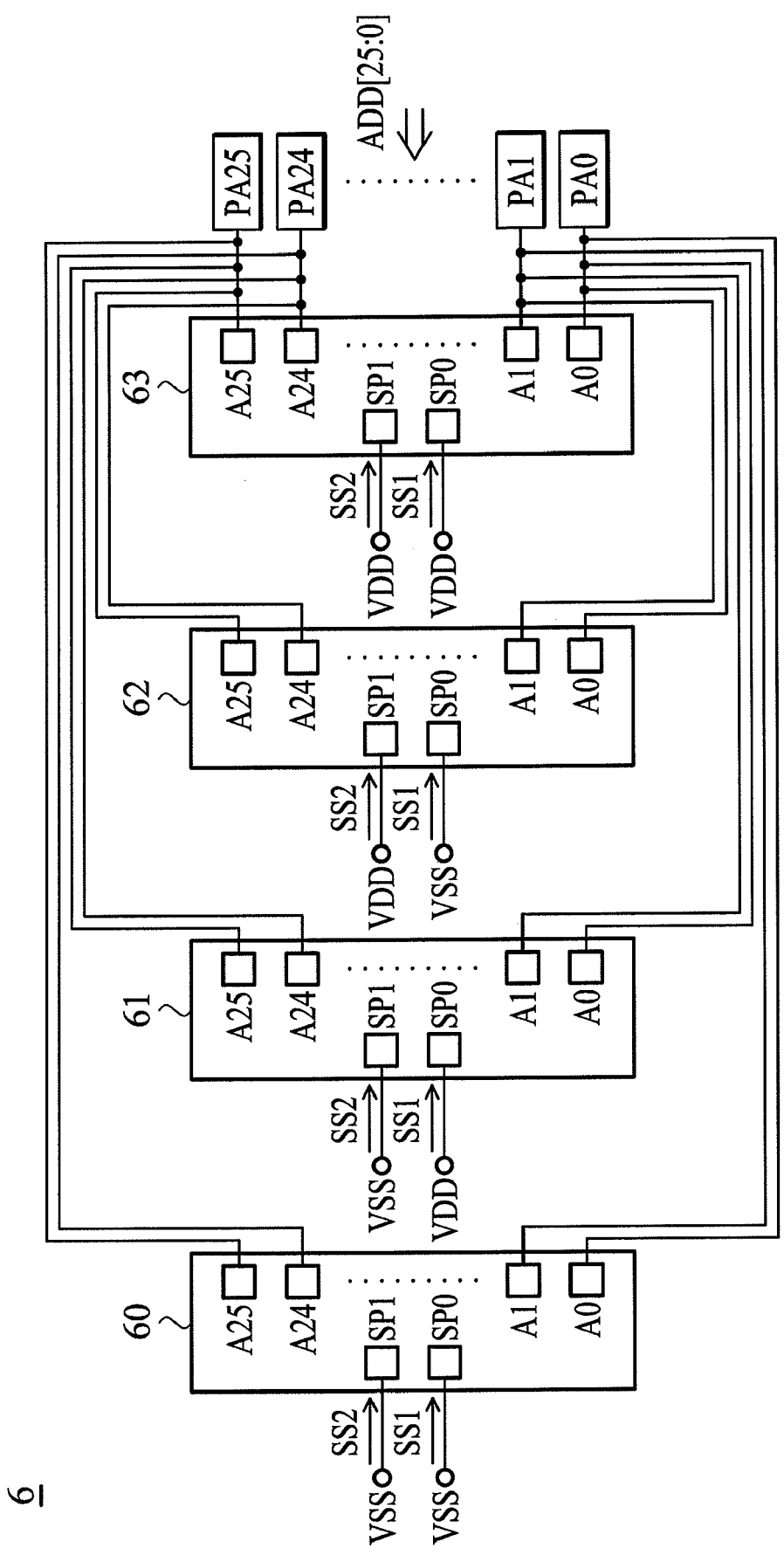
FIG. 6 is a schematic view showing connections between address pads of the four stacked memory chips.

In the above embodiment, two stacked memory chips in one memory device are given as an example. In some embodiments, one memory device may comprise more than two stacked memory chips. Referring to FIG. 6, a memory device 6 comprises four stacked memory chips 60~63. In order to clearly show the connection, the four memory chips 60~63 are shown side by side, and, however, in practice, the four memory chips 60~63 are stacked sequentially from bottom to top. Each memory chip comprises 26 address pads A0~A25 and two selection pads SP0~SP1 which receive selection signals SS1 and SS2 respectively. The memory chips 60~63 receive an input address code ADD[25:0] through address pads PA0~PA25 and the respective address pads A0~A25. For each memory chip, when the logic values of the selection signals SS1 and SS2 are determined, which one of the memory chips 60~63 is selected to be activated is determined according to whether the logic value of the $25^{th}$ bit ADD[24] and the logic value of the selection signal SS1 are equal and whether the logic value of the $26^{th}$ bit ADD[25] and the logic value of the selection signal SS2 are equal. In an embodiment, for each memory chip, the logic values of the selection signals SS1 and SS2 relate to a sequence for accessing the memory chips 60~63.

In FIG. 6, the selection pads SP0 and SP1 of the memory chip 60 are tied to the selection signal SS1 with a low voltage level of a voltage source VSS and the selection signal SS2 with the low voltage level of the voltage source VSS, respectively. The selection pads SP0 and SP1 of each memory chip 61, 62 and 63 are tied to the selection signal SS1 with a high voltage level of a voltage source VDD and the selection signal SS2, with the low voltage level of the voltage source VSS, respectively. When one selection pad is tied to a selection signal with a high voltage level of the voltage source VDD, the logic value of the selection signal is equal to "1"; when one selection pad is tied to a selection signal with a low voltage level of the voltage source VSS, the logic value of the selection signal is equal to "0".

For example, when the address pad PA24 receives the $25^{th}$ bit ADD[24] with a logic high value (ADD[24]=1) and the address pad PA25 receives the $26^{th}$ bit ADD[25] with a logic high value (ADD[25]=1), the memory chip 63 is selected to be activated (active mode) due to the fact that the logic values of the selection signals SS1 and SS2 are both equal to "1", while the other memory chips 60~62 are inactivated (inactive mode). When the address pad PA24 receives the $25^{th}$ bit ADD[24] with a logic low value (ADD[24]=0) and the address pad PA25 receives the $26^{th}$ bit ADD[25] with a logic high value (ADD[25]=1), the memory chip 62 is selected to be activated (active mode) due to the fact that the logic values of the selection signals SS1 and SS2 are equal to "0" and "1" respectively, while the other memory chips 60~61 and 63 are inactivated (inactive mode).

In the embodiment of FIG. 6, at the beginning of an access operation performed on the memory device 6, for each of the memory chips 60~63, the $1^{th}$~$24^{th}$ bits ADD[0]~ADD[23] of the input address code ADD initially serve as the $1^{th}$~$24^{th}$ bits of a respective internal address counter code. In other words, for each of the memory chips 60~63, the values of the $1^{th}$~$24^{th}$ bits of the respective internal address counter code are initially set as the values of the $1^{th}$~$24^{th}$ bits ADD[0]~ADD[23] of the input address code ADD, respectively. Moreover, at the beginning of the access operation, for each of the memory chips 60~63, the most significant bit set of the respective internal address counter code is initially set according to the most significant bit set of the input address code ADD and the respective selection signal. In the embodiment, the most significant bit set of the input address code ADD comprises two bits, that is, the $25^{th}$ and $26^{th}$ bits ADD [24] and ADD[25], and for each of the memory chips 60~63, the most significant bit set of the respective internal address counter code also comprises two bits, that is, the $25^{th}$ and $26^{th}$. Accordingly, the $25^{th}$ bit of the respective internal address counter code is initially set by performing a logical exclusive OR (XOR) operation to the $25^{th}$ bit ADD[24] of the input address code ADD and the logic value of the respective selection signal SS1, and the $26^{th}$ bit of the respective internal address counter code is initially set by performing a logical exclusive OR (XOR) operation to the $26^{th}$ bit ADD[25] of the input address code ADD and the logic value of the respective selection signal SS2. When both of the $25^{th}$ bit and the $26^{th}$ bit of the respective internal address counter code are equal to a logic low value ("0"), the corresponding memory chip is activated (active mode). When at least one of the $25^{th}$ bit and the $26^{th}$ bit of the respective internal address counter code is equal to a logic high value ("1"), the corresponding memory chip is inactivated (inactive mode).

According to the above embodiment, at the beginning of the access operation performed on the memory chip 6, the internal address counter codes of the memory chips 60~63 are initially set according to the input address ADD and the respective selection signals SS1 and SS2. The operation modes of the memory chips 60~63 at the beginning of the access operation can be determined according to the initial values of the internal address counter codes of the memory chips 60~63; especially the $25^{th}$ bits and the $26^{th}$ bits of each of the internal address counter codes. After, the internal address counter codes of the memory chips 60~63 are increased by respective internal counters of the memory chips 60~63, the $25^{th}$ bits and the $26^{th}$ bits the of the internal address counter codes of the memory chips 60~63 are changed between "0" and "1" with the countering operation. Thus, the memory chips 60~63 can operate between the active mode and the inactive mode according to the respective internal address counter codes.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory device comprising:
   a plurality of memory chips for receiving an input address code and alternately operating in an active mode;
   wherein each memory chip receives a selection signal and operates according to an internal address counter code; and
   wherein for each memory chip, the respective internal address counter code is initially set according to the input address code and the respective selection signal; and
   wherein for each memory chip, after the respective internal address counter code is initially set, the respective internal address counter code is continuously increased by an internal counter of the memory chip.

2. The memory device as claimed in claim 1, wherein for each memory chip, a most significant bit set of the respective internal address counter code is initially set according to a most significant bit set of the input address code and a logic value of the selection signal.

3. The memory device as claimed in claim 2, wherein for each memory chip, the most significant bit set of the respective internal address counter code is initially set by performing a logical exclusive OR (XOR) operation to the most significant bit set of the input address code and the logic value of the respective selection signal.

4. The memory device as claimed in claim 3, wherein for each memory chip, except for the most significant bit sets of the input address code and the respective internal address counter code, the other bits of the input address code initially serve as the other bits of the respective internal address counter code.

5. The memory device as claimed in claim 2, wherein when the plurality of memory chips comprise two memory chips, for each memory chip, the most significant bit set of the input address code comprises one bit, the most significant bit set of the respective internal address counter code comprises one bit, and the logic value of the respective selection signal is determined according to a voltage level.

6. The memory device as claimed in claim 5, wherein when one of the two memory chips operates in the active mode according to the respective internal address code whose most significant bit set is at a first value, the other of the two memory chips operates in an inactive mode according to the respective internal address code whose most significant bit set is at a second value opposite to the first value.

7. The memory device as claimed in claim 1, wherein when one of the plurality of memory chips operates in the active mode according to the respective internal address code, the other of the plurality of memory chips operate in an inactive mode according to the respective internal address codes.

8. A memory device comprising:
   a first memory chip for receiving an input address code and a first selection signal and operating according to a first internal address counter code; and
   a second memory chip for receiving the input address code and a second selection signal and operating according to a second internal address counter code;
   wherein a most significant bit of the first internal address counter code is initially set by performing a logical exclusive OR (XOR) operation to a most significant bit of the input address code and a logic value of the first selection signal; and
   wherein a most significant bit of the second internal address counter code is initially set by performing the XOR operation to a most significant bit of the input address code and the logic value of the second selection signal.

9. The memory device as claimed in claim 8, wherein the first and second memory chips alternately operate in an active mode.

10. The memory device as claimed in claim 9, wherein when the first memory chips operates in the active mode according to the first internal address code whose most significant bit is at a first value, the second memory chip operates in an inactive mode according to the second internal address code whose most significant bit is at a second value opposite to the first value.

11. The memory device as claimed in claim 8, wherein except for the most significant bits of the input address code and the first and second internal address counter codes, the other bits of the input address code initially serve as the other bits of the first internal address counter code and the other bits of the second internal address counter code.

12. The memory device as claimed in claim 8, wherein the logic value of each of the first and second selection signals is determined according to a voltage level.

13. An accessing method for a memory device which comprises a plurality of memory chips, wherein the plurality of memory chips receive an input address code, and each memory chip receives a selection signal, the accessing method comprises:
   for each memory chip, initially setting of the respective internal address counter code according to the input address code and the respective selection signal;
   for each memory chip, after the respective internal address counter code is initially set, continuously increasing the respective internal address counter code by an internal counter of the memory chip; and
   controlling each memory chip to operate in an active mode or an inactive mode according to the respective internal address counter code.

14. The accessing method as claimed in claim 13, wherein the step of initially setting the respective internal address counter code for each memory chip comprises:
   for each memory chip, initially setting a most significant bit set of the respective internal address counter code according to a most significant bit set of the input address code and a logic value of the selection signal.

15. The accessing method as claimed in claim 14, wherein for each memory chip, the most significant bit set of the respective internal address counter code is initially set by performing a logical exclusive OR (XOR) operation to the most significant bit set of the input address code and the logic value of the respective selection signal.

16. The accessing method as claimed in claim 15, wherein the step of initially setting the respective internal address counter code for each memory chip further comprises:
   for each memory chip, except for the most significant bit sets of the input address code and the respective internal address counter code, the other bits of the input address code initially serving as the other bits of the respective internal address counter code.

17. The accessing method as claimed in claim 13, wherein the plurality of memory chips alternately operate in the active mode.

* * * * *